United States Patent
Johnson et al.

(10) Patent No.: US 8,453,101 B1
(45) Date of Patent: May 28, 2013

(54) METHOD, SYSTEM AND PROGRAM STORAGE DEVICE FOR GENERATING ACCURATE PERFORMANCE TARGETS FOR ACTIVE SEMICONDUCTOR DEVICES DURING NEW TECHNOLOGY NODE DEVELOPMENT

(75) Inventors: James M. Johnson, Milton, VT (US); Scott K. Springer, Burlington, VT (US); Rainer Thoma, Essex Junction, VT (US); Josef S. Watts, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/302,350

(22) Filed: Nov. 22, 2011

(51) Int. Cl.
   *G06F 11/22* (2006.01)
   *G06F 17/50* (2006.01)

(52) U.S. Cl.
   USPC ........... 716/136; 716/134; 716/133; 716/112; 716/111

(58) Field of Classification Search
   USPC ................ 716/106, 108, 111, 112, 113, 133, 716/134
   See application file for complete search history.

(56) References Cited

U.S. PATENT DOCUMENTS

| | | | |
|---|---|---|---|
| 5,319,564 A | 6/1994 | Smayling et al. | |
| 5,719,796 A | 2/1998 | Chen | |
| 5,867,397 A | 2/1999 | Koza et al. | |
| 5,966,312 A | 10/1999 | Chen | |
| 6,314,390 B1 | 11/2001 | Bittner et al. | |
| 6,896,561 B2 | 5/2005 | Lai | |
| 6,934,671 B2 | 8/2005 | Bertsch et al. | |
| 7,568,179 B1 | 7/2009 | Kroyan et al. | |
| 7,844,927 B2 | 11/2010 | Wu et al. | |
| 8,010,930 B2 | 8/2011 | Trombley et al. | |
| 2003/0114944 A1 | 6/2003 | Bernstein et al. | |
| 2007/0288116 A1* | 12/2007 | Al-Bayati et al. | 700/121 |
| 2008/0177523 A1 | 7/2008 | Wu et al. | |
| 2008/0195941 A1* | 8/2008 | Shibuya et al. | 715/700 |
| 2011/0153055 A1* | 6/2011 | Sheu et al. | 700/121 |

OTHER PUBLICATIONS

IBM Corporation, IPCOM148210D, "Algorithms for MOSFET Compact Model Quality Checks" pp. 1-3, Mar. 29, 2007.

BM Corporation, IPCOM148209D, "Method for partitioning the difference between hardware and specification electrical parameters into geometric and electrical components" pp. 1-2, Mar. 29, 2007.

* cited by examiner

*Primary Examiner* — Vuthe Siek
*Assistant Examiner* — Brian Ngo
(74) *Attorney, Agent, or Firm* — Gibb & Riley, LLC; Anthony J. Canale

(57) ABSTRACT

Disclosed are embodiments of a method, system and program storage device for generating accurate performance targets for active semiconductor devices during technology node development in order to reduce the number of iterations required for model extraction and/or to improve model quality. In these embodiments, initial sets of performance targets for related semiconductor devices are generated, e.g., by making assumptions based on hardware measurements taken from semiconductor devices in prior technology nodes. Additional processes are then performed on the initial sets of performance targets prior to the modeling stage in order to detect and resolve any inconsistencies between the data in the sets. Specifically, plotting techniques are performed with respect to the performance targets. The results are analyzed to detect any inconsistencies indicating that the performance targets are inaccurate and adjustments are made to the performance targets in order to resolve those inconsistencies.

25 Claims, 13 Drawing Sheets

| PERFORMANCE TARGET | CURRENT | GATE VOLTAGE Vg | DRAIN VOLTAGE VD |
|---|---|---|---|
| SATURATION CURRENT | Idsat | VDD | VDD |
| LINEAR CURRENT | Idlin | VDD | Vlin |
| LINEAR THRESHOLD VOLTAGE | IVT* | Vtlin | Vlin |
| SATURATION THRESHOLD VOLTAGE | IVT | Vtstat | VDD |
| HIGH CURRENT | Ihigh | VDD | VDD / 2 |
| LOW CURRENT | Ilow | VDD / 2 | VDD |
| LEAKAGE CURRENT | Ioff | 0 | VDD |
| SUB-THRESHOLD SLOPE | Iss** | Vlin | VDD |

\* IVT=70nA·WIDTH / LENGTH FOR PFET AND IVT = 300nA·WIDTH / LENGTH FOR NFET

\*\* $Log_{10}Iss = Log_{10}Ioff + SSSAT \cdot VLin$

FIG. 2

| GATE LENGTH | | RVTPGET | | | HVTPFET | | | MVTPFET | | |
|---|---|---|---|---|---|---|---|---|---|---|
| | | VALUE | SLOPE | CURVE | VALUE | SLOPE | CURVE | VALUE | SLOPE | CURVE |
| Cgate-on [fF/um] | CGONWEFFCV_FF/UM | O.K. | | | O.K. | | | O.K. | | |
| Single-point Vt current [nA] | IVTWDES_NA | O.K. | | | O.K. | | | O.K. | | |
| Vtlin (src) [V] | VTSLINWDES_V | | O.K. | O.K. | | O.K. | O.K. | | O.K. | O.K. |
| Vtsat (src) [V] | VTSSATWDES_V | | O.K. | O.K. | | O.K. | O.K. | | O.K. | O.K. |
| DIBL (src) [V] | DIBLSWDES_V | O.K. | | | O.K. | | | O.K. | | |
| Linear Subth.Slope (src) [mV/dec] | SSSLIN_MV/DEC | | #DIV/0! | #DIV/0! | | #DIV/0! | #DIV/0! | | #DIV/0! | #DIV/0! |
| Sat. Subth.Slope (src) [mV/dec] | SSSSAT_MV/DEC | O.K. | O.K. | O.K. | O.K. | O.K. | O.K. | O.K. | O.K. | O.K. |
| Ioff (src) [nA/um] | ISOFFSATWDES_NA/UM | | O.K. | O.K. | | O.K. | O.K. | | | |
| | #_ | | | | | | | | | |
| Ieff (drn) [uA/um] | IDEFFWDES_UA/UM | O.K. | O.K. | O.K. | O.K. | O.K. | O.K. | O.K. | O.K. | ERROR |
| Ihigh (drn) [uA/um] | IIDHIGHWDES_UA/UM | | O.K. | O.K. | | O.K. | O.K. | | O.K. | O.K. |
| Ilow (drn) [uA/um] | IDLOWWDES_UA/UM | | O.K. | O.K. | | O.K. | O.K. | | ERROR | ERROR. |
| Ilin (drn) [uA/um] | IDLINWDES_UA/UM | | O.K. | O.K. | | O.K. | O.K. | | O.K. | O.K. |
| Isat (drn) [uA/um] | IDSATWDES_UA/UM | | O.K. | O.K. | | O.K. | O.K. | | O.K. | O.K. |
| Iodlin (dm) [uA/um] | IOLINWDES_UA/UM | | O.K. | O.K. | | O.K. | O.K. | | O.K. | O.K. |

FIG. 14

METHOD, SYSTEM AND PROGRAM STORAGE DEVICE FOR GENERATING ACCURATE PERFORMANCE TARGETS FOR ACTIVE SEMICONDUCTOR DEVICES DURING NEW TECHNOLOGY NODE DEVELOPMENT

BACKGROUND

1. Field of the Invention

The embodiments herein relate to generating performance targets for active semiconductor devices and, more particularly, to a method, system and program storage device for generating more accurate performance targets for active semiconductor devices during new technology node development.

2. Description of the Related Art

During the early stages of new technology node development, engineers do not have actual hardware from which to take performance measurements. Thus, they will typically generate performance targets (i.e., target performance characteristics) for active semiconductor devices in the new technology node based on assumptions and on measurements taken from hardware in previous technology nodes. Unfortunately, such performance targets may turn out to be incorrect and lead, at the modeling stage of the new technology node development, to unnecessary and time consuming iterations for the model extraction process and/or inferior model quality.

At the stage following the early stage of technology development (i.e., during the technology development stage of process optimization) prototype hardware (i.e., early hardware) will be available and will be utilized to influence the model build as much as possible. Specifically, prototype hardware measurements will be taken and plotted against the performance targets to visually determine whether the performance targets that will be used for modeling are supported by the hardware measurements (i.e., to visually verify the accuracy of the performance targets). These prototype hardware measurements may, however, be influenced by defects and strong process variations. Consequently, the resulting plots may be affected by large statistical errors and, thereby may provide support for inaccurate performance targets (e.g., for performance targets which actually violate the principles of semiconductor device physics and/or scaling laws). When such inaccurate performance targets are used as model inputs, they may lead to contradictions during the model build and will be rejected outright such that new performance targets have to be generated and verified, thereby leading to unnecessary and time consuming iterations for the model extraction process. Furthermore, if the inaccurate performance targets are not rejected outright, their use as model inputs could lead to inferior model quality and, thereby false conclusions performance.

Therefore, there is a need in the art for a technique for generating more accurate performance targets for active semiconductor devices during the technology node development stage in order to reduce the number of iterations required for the model extraction process and/or improve model quality.

SUMMARY

Disclosed herein are embodiments of a computer-implemented method as well as an associated system and program storage device for generating more accurate performance targets (i.e., target performance characteristics) for active semiconductor devices during the technology node development stage in order to reduce the number of iterations required for model extraction and/or to improve model quality. In these embodiments, initial sets of performance targets for related semiconductor devices can be generated using, for example, prior art techniques of making assumptions based on hardware measurements taken from semiconductor devices in prior technology nodes and/or from preliminary hardware with limited quality of the technology node under development and/or numerical simulations (Technology Computer Aided Design) for the same technology node. However, instead of simply relying on these initial sets for model extractions, additional processes can be performed prior to the modeling stage to detect and resolve any inconsistencies between the data in the sets. Specifically, various plotting techniques can be performed with respect to the performance targets and the results can be analyzed to detect any inconsistencies, which may indicate inaccurate performance targets and, particularly, which may indicate that the performance targets would violate the laws of device physics. Then adjustments can be made to the performance targets in order to resolve those inconsistencies.

More particularly, disclosed herein are embodiments of a computer-implemented method for generating more accurate performance targets (i.e., target performance characteristics) for related semiconductor devices. Each of the method embodiments can comprise accessing, by a computer, initial sets of performance targets. Each initial set can be associated with a corresponding one of the related semiconductor devices and can comprise multiple performance targets associated with multiple values of multiple parameters (e.g., physical and/or operational parameters). Next, instead of simply relying on these initial sets, additional processes can be performed to detect and resolve any inconsistencies between the performance targets in the initial sets. Specifically, various plotting techniques can be performed with respect to the performance targets and the results can be analyzed to detect any inconsistencies and to make adjustments to the performance targets in order to resolve those inconsistencies.

In one embodiment, these additional processes can comprise plotting in a first graph multiple first curves such that each first curve represents values of a specific performance target for a corresponding one of the related semiconductor devices as a function of values of a specific parameter. The first graph can then be analyzed (e.g., either by a computer or visually by a user) to identify inconsistencies in the performance targets of the initial sets and to adjust the performance targets to resolve the inconsistencies. Optionally, this plotting process can further comprise plotting, in a second graph that corresponds to the first graph, multiple second curves such that each second curve is associated with one of the first curves and represents deviations in the values of the specific performance target from a nominal performance value as a function of the values of the specific parameter. In this case, the analyzing process can also comprise analyzing the second graph to further help identify the inconsistencies. The plotting and analyzing processes can be repeated for each of the multiple parameters and each of the performance targets.

In another embodiment, these additional processes can comprise plotting, in a graph, multiple curves such that each curve represents values of a first performance target as a function of values of a second performance target for a specific value of a specific parameter in all of the related semiconductor devices. This graph can then be analyzed (e.g., either by a computer or visually by a user) to identify inconsistencies in the performance targets of the initial sets and to adjust the performance targets to resolve the inconsistencies. The plotting and analyzing processes can be repeated for each of the multiple parameters and each combination of the performance targets.

In yet another embodiment, these additional processes can comprise plotting, in a first graph, multiple first curves such that each first curve represents values of a specific performance target for a corresponding one of the related semiconductor devices as a function of values of a specific parameter. This process can then be repeated for other performance targets (e.g., saturation drain current (Idsat), linear drain current (Idlin), high current (Ihigh), low current (Ilow), effective drive current (Ieff), and/or leakage current (Ioff), etc.) so that multiple first graphs are generated. Each first graph can be analyzed (e.g., either by a computer or visually by a user) to identify inconsistencies in the performance targets of the initial sets and to adjust the performance targets to resolve the inconsistencies. These process steps are essentially the same as the initial process steps discussed above with regard to the initial embodiment, described above. However, in this embodiment, at least some of the first graphs can, optionally, be combined into a single second graph. That is, in the second graph, multiple second curves can be plotted such that each second curve is associated with a corresponding one of the first graphs and represents changes in slope of the multiple first curves from that first graph as a function of saturation threshold voltage (Vtsat) values. Thus, in this case, the analyzing process can also comprise analyzing the second graph to further help identify the inconsistencies.

In yet another embodiment it is the goal to construct current over voltage (I/V) curves, as commonly used in device characterization, from the available set of performance targets. The additional processes of this embodiment can comprise plotting, in a graph, multiple curves such that each curve is associated with a specific parameter and represents values of a terminal current target (e.g., values for source current (Is) or drain current (Id)) as a function of values of a terminal bias condition (e.g., values for the gate voltage (Vg) or drain voltage (Vd)). Each curve can represent a specific value of the specific parameter for all of the related semiconductor devices, as in the second embodiment described above. Alternatively, however, each curve can represent a different one of the related semiconductor devices for a specific value of the specific parameter. In any case, this graph can then be analyzed (e.g., either by a computer or visually by a user) to identify inconsistencies in the performance targets of the initial sets and to adjust the performance targets to resolve the inconsistencies.

As described above, the additional processes used to detect and resolve any inconsistencies between the data in the initial sets of performance targets can be performed in the alternative. However, it should be understood that these additional processes could also be performed in combination in order to further increase inconsistency detection sensitivity (i.e., increase the likelihood that any inconsistencies in the performance targets will be detected) and, thereby increase the accuracy of the performance targets, as adjusted.

Also disclosed herein are embodiments of computer for implementing the above-describe method embodiments and a non-transitory program storage device readable by a computer and tangibly embodying a program of instructions executable by the computer to perform the above-described method embodiments.

BRIEF DESCRIPTION OF THE SEVERAL VIEWS OF THE DRAWINGS

The embodiments herein will be better understood from the following detailed description with reference to the drawings, which are not necessarily drawing to scale and in which:

FIG. 2 is a table illustrating relationships between performance targets and terminal bias conditions;

FIG. 14 is an exemplary summary table that can be generated at process step 108 of FIG. 1.

DETAILED DESCRIPTION

Figure 1:
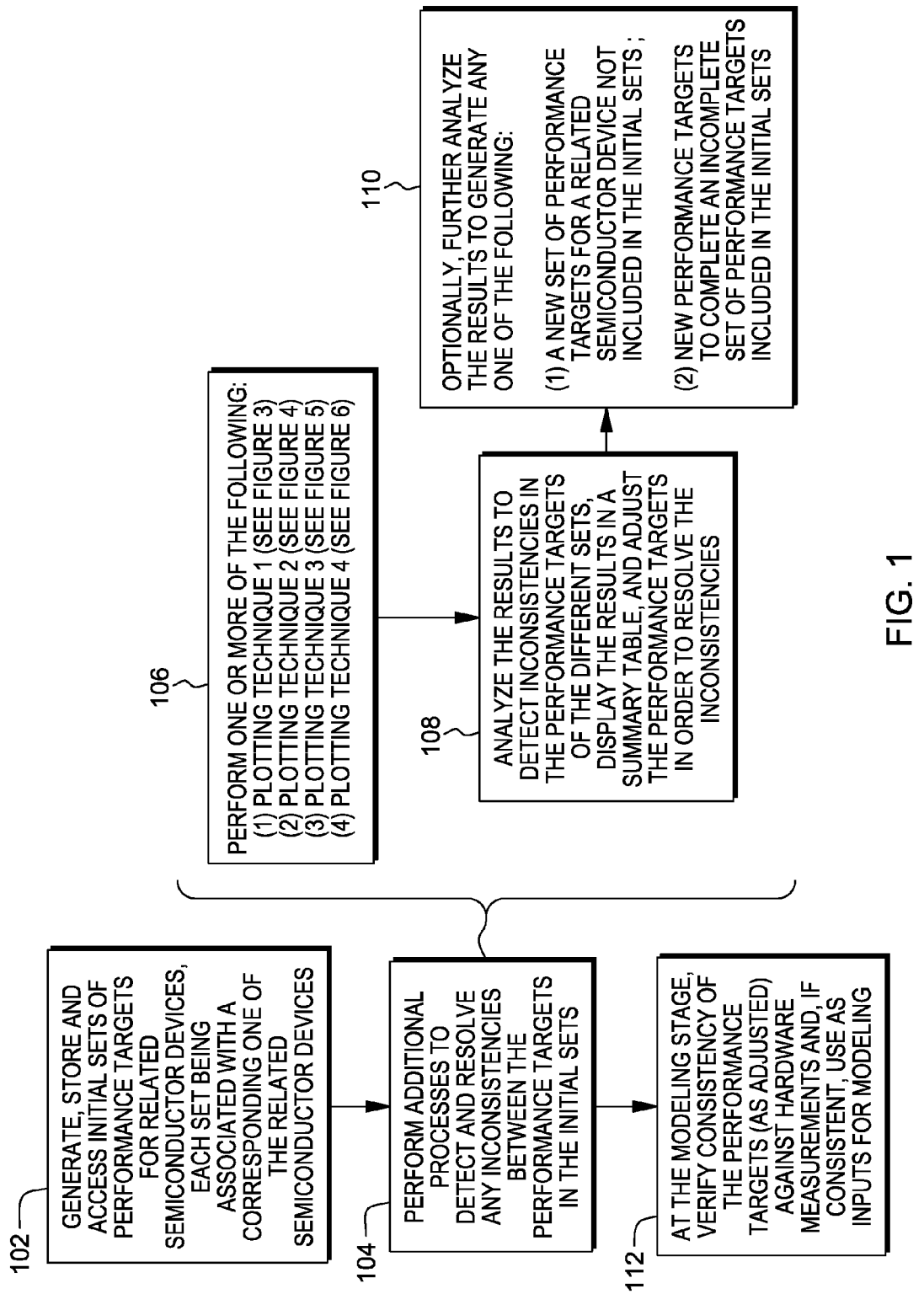
FIG. 1 is a flow diagram illustrating an embodiment of a method of generating accurate performance targets for active semiconductor devices during technology node development.

The various embodiments described below are presented for purposes of illustration, but are not intended to be exhaustive or limiting. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As mentioned above, during the early stages of new technology node development, engineers do not have actual hardware from which to take performance measurements. Thus, they will typically generate performance targets (i.e., target performance characteristics) for active semiconductor devices in the new technology node based on assumptions and on measurements taken from hardware in previous technology nodes. Unfortunately, such performance targets may turn out to be incorrect and lead, at the modeling stage of the new technology node development, to unnecessary and time consuming iterations for the model extraction process and/or inferior model quality.

At the stage following the early stage of technology development (i.e., during the technology development stage of process optimization), prototype hardware measurements (i.e., early hardware) will be available and utilized to influence the model build as much as possible. Specifically, prototype hardware measurements will be taken and plotted against the performance targets to visually determine whether the performance targets that will be used for modeling are supported by the hardware measurements (i.e., to visually verify the accuracy of the performance targets). These prototype hardware measurements may, however, be influenced by defects and strong process variations. Consequently, the resulting plots may be affected by large statistical errors and, thereby may provide support for inaccurate performance targets (e.g., for performance targets which actually violate the principles of semiconductor device physics and/or scaling laws). When such inaccurate performance targets are used as model inputs, they may lead to contradictions during the model build and will be rejected outright such that new performance targets have to be generated and verified, thereby leading to unnecessary and time consuming iterations for the model extraction process. Furthermore, if the inaccurate performance targets are not rejected outright, their use as model inputs could lead to inferior model quality and, thereby false conclusions of performance.

In view of the foregoing, disclosed herein are embodiments of a computer-implemented method as well as an associated system and program storage device for generating more accurate performance targets (i.e., target performance characteristics) for active semiconductor devices during the technology node development stage in order to reduce the number of iterations required for model extraction and/or to improve model quality. In these embodiments, initial sets of performance targets for related semiconductor devices can be generated using, for example, prior art techniques of making assumptions based on hardware measurements taken from semiconductor devices in prior technology nodes and/or from preliminary hardware with limited quality of the technology node under development and/or numerical simulations (Technology Computer Aided Design) for the same technology node. However, instead of simply relying on these initial sets at the modeling stage, additional processes can be performed prior to the modeling stage to detect and resolve any inconsistencies between the data in the sets. Specifically, various plotting techniques can be performed with respect to the performance targets and the results can be analyzed to detect any inconsistencies, which may indicate inaccurate performance targets and, particularly, which may indicate that the performance targets would violate the laws of device physics. Then adjustments can be made to the performance targets in order to resolve those inconsistencies.

More particularly, referring to the flow diagram of FIG. 1, disclosed herein are embodiments of a computer-implemented method for generating more accurate performance targets (i.e., target performance characteristics) for related semiconductor devices during the new technology node development stage in order to reduce the number of iterations required for model extraction and/or to improve model quality.

It should be understood that the disclosed method embodiments could be implemented, in whole or in part, in a computer hardware environment (e.g., a computer system) such as that described in detail below and depicted in FIG. 15. Alternatively, the method embodiments could be implemented on any other computerized device having the required data storage and processing capability to perform the described plotting and analyzing processes (e.g., a laptop computer, tablet computer, handheld device, smart phone, etc.). It should further be understood that, as used herein, the term "related semiconductor devices" refers to devices of the same type (e.g., transistors) having essentially the same geometry (e.g., the same size in terms of channel length and width), but different threshold voltages (Vt) (e.g., regular threshold voltage (RVT), high threshold voltage (HVT), mezzanine threshold voltage (MVT), super-high threshold voltage (SVT), low threshold voltage (LVT), ultra-high threshold voltage (UVT), etc.) and, thereby different off currents (Ioff). Thus, in the exemplary embodiments described herein the related devices are described in terms, for example, of a regular threshold voltage (RVT) transistor, a high threshold voltage (HVT) transistor, a mezzanine threshold voltage (MVT) transistor, a super-high threshold voltage (SVT) transistor, a low threshold voltage (LVT) transistor, an ultra-high threshold voltage (UVT) transistor, etc. Those skilled in the art will recognize that such transistors having essentially the same geometry but different threshold voltages can be achieved as a function, for example, of different doping profiles (e.g., different well doping depths and concentrations, different halo doping depths and concentrations, etc.), different dielectric materials and/or thicknesses, etc.

Each of the method embodiments can comprise generating, storing and accessing initial sets of performance targets (i.e., initial sets of target performance characteristics) for related semiconductor devices (102). Specifically, each initial set can be associated with a corresponding one of the related transistors and can comprise multiple performance targets associated with multiple values of multiple parameters. The performance targets can comprise, for example, various current-voltage (I-V) and/or capacitance characteristics, such as, saturation drain current (Idsat), linear drain current (Idlin), linear threshold voltage (Vtlin), saturation threshold voltage (Vtsat), high current (Ihigh), low current (Ilow), effective drive current (Jeff), leakage current (Ioff), gate on capacitance (Cgate-on), etc. FIG. 2 is a table illustrating the relationship between such performance targets and the voltage bias conditions on the terminals of the devices (i.e., the gate voltage (Vg) and the drain voltage (Vd)). The multiple parameters with values that impact these performance targets can comprise physical and/or operational parameters including, but not limited to, gate length, gate width, operating temperature and operating supply voltage. The initial sets of performance targets can be generated, for example, using the prior art techniques of making assumptions based on hardware measurements taken from similar semiconductor devices in prior technology nodes and/or from prototype hardware from the same technology node and/or numerical simulations (Technology Computer Aided Design) for the same technology node. Next, instead of simply relying on these initial sets, additional processes can be performed to detect and resolve any inconsistencies between the performance targets in the initial sets (104).

These additional processes can comprise performing any one or more plotting techniques with respect to the initial sets of performance targets for the related transistors, as discussed in greater detail below and illustrated in FIGS. 3-6, respectively (106). Then, the results (i.e., the resulting graphs) can be analyzed to detect inconsistencies in the performance targets of the different sets (e.g., as indicated by differences in the slopes and/or curvatures of the curves on each graph as well as by any intersections between the curves on each graph, see detailed discussion below) and to adjust the performance targets in order to resolve those inconsistencies (108).

Figure 3:
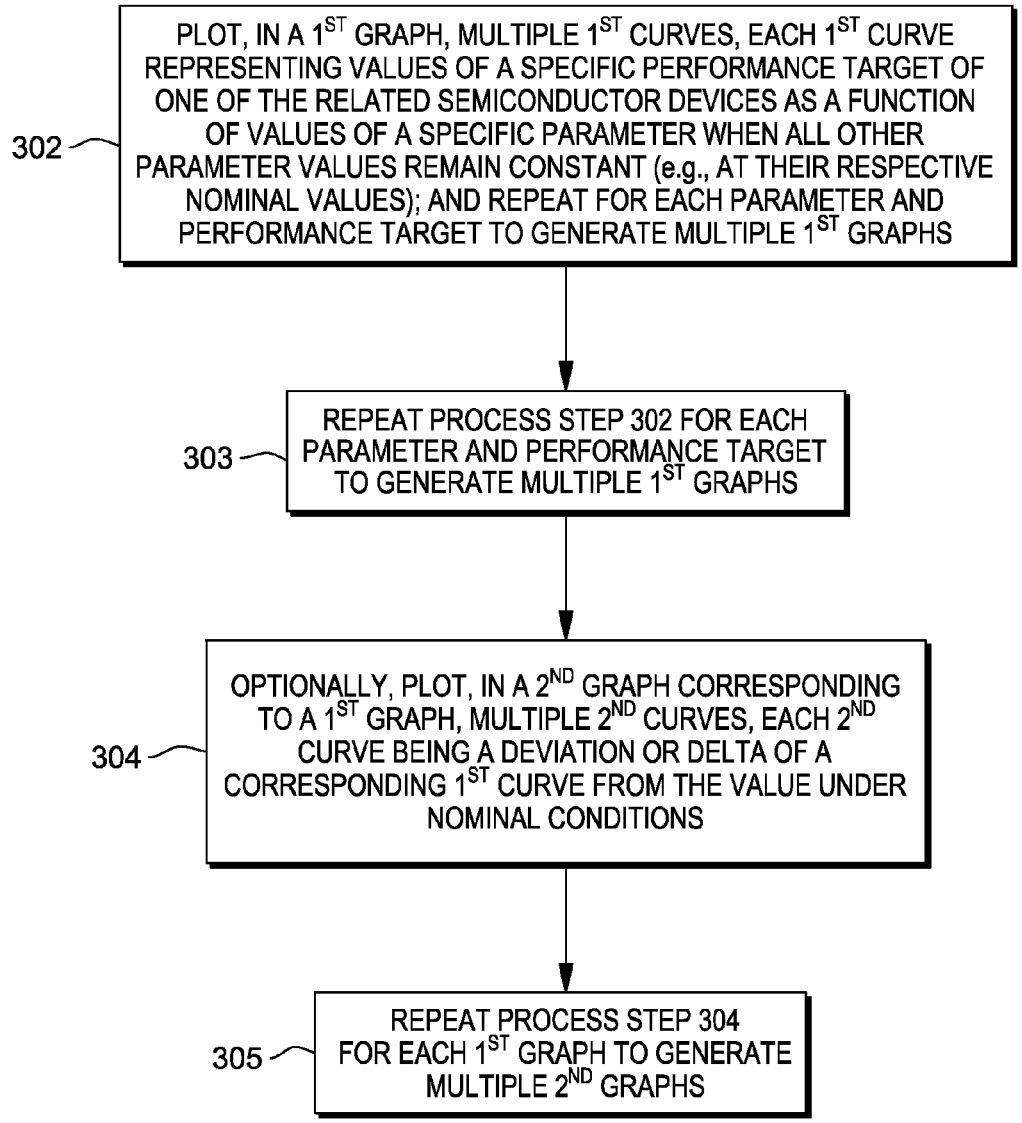
FIG. 3 is a flow diagram illustrating an exemplary plotting technique that can be incorporated into the method of FIG. 1.
Figure 7:
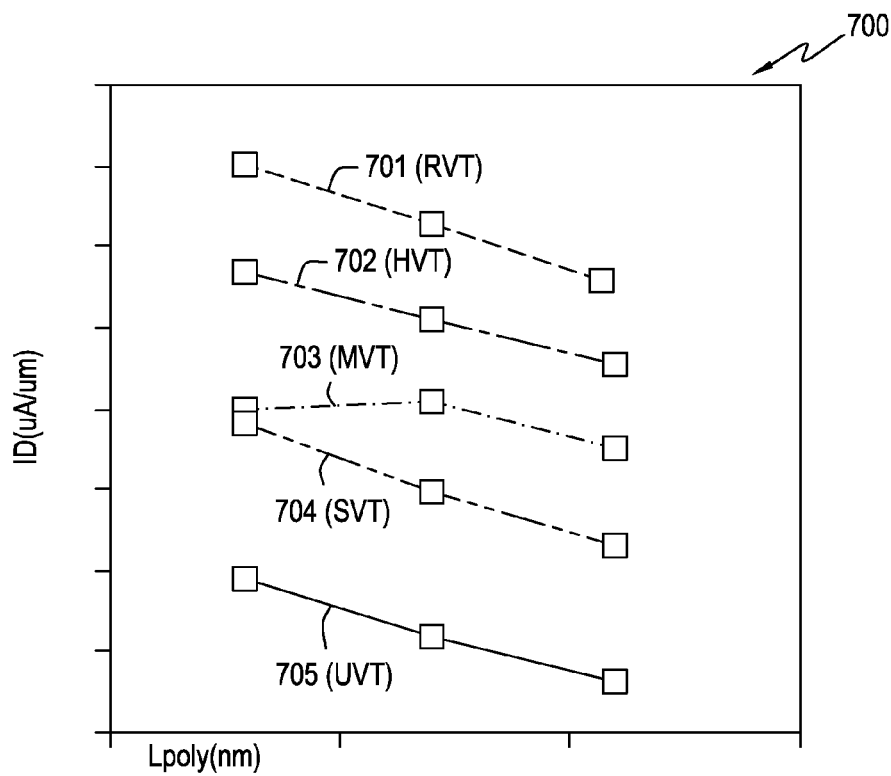
FIG. 7 is a graph illustrating process step 302 of FIG. 3.

Specifically, in one embodiment as illustrated in the flow diagram of FIG. 3, multiple first curves can be plotted (i.e., graphed) on a first graph such that the first graph represents one specific parameter and such that each first curve on the first graph represents values of a specific performance target as a function of values of the specific parameter for one of the related semiconductor devices (302). For example, FIG. 7 shows an exemplary first graph that represents the specific parameter of gate length (Lpoly (nm)). In this exemplary first graph, each first curve 701-705 represents one of multiple different, but related transistors (i.e., transistors having essentially identical geometries but different threshold voltages (Vt), such as a regular threshold voltage (RVT) 701, a high threshold voltage (HVT) 702, a mezzanine threshold voltage (MVT) 703, a super-high threshold voltage (SVT) 704, and an ultra-high threshold voltage (UVT) 705). For each of the related transistors, values for a specific performance target, namely a current target (ID ($\mu$A/$\mu$m) such as effective drive current (Ieff), are plotted to a values of a specific parameter, namely gate length (Lpoly (nm)). This plotting process 302 can be performed assuming that all other parameters are set at their respective nominal values (e.g., the operating temperature is set at 25° C., etc.). This plotting process 302 can further be repeated (303) such that similar first graphs are generated with respect to each of the other multiple parameters at issue (e.g., gate width, operating temperature, operating supply voltage, etc.) and each of the other multiple performance targets at issue (e.g., saturation drain current (Idsat), linear drain current (Idlin), linear threshold voltage (Vtlin), saturation threshold voltage (Vtsat), high current (Ihigh), low current (Ilow), effective drive current (Ieff), leakage current (Ioff), gate on capacitance (Cgate-on), etc.).

Optionally, multiple second curves can further be plotted (i.e., graphed) on a second graph such that the second graph corresponds to one of the first graph (304). The second graph can represent the same specific parameter as the corresponding first graph. Each second curve on the second graph can be associated with one of the first curves on the corresponding first graph and can illustrate deviations (i.e., changes, deltas $\Delta$) in the values for the specific performance target on the first curve as compared to a nominal performance value (i.e., as compared to a performance value under nominal conditions) as a function of the values of the specific parameter (304). It should be noted that for any threshold voltage (Vt) target value this deviation can be defined in terms of the difference between the threshold voltage target value and the nominal threshold voltage value (e.g., $Vt_{target}-Vt_{nominal}$). However, for any current (I) value, this deviation can be defined in terms of the ratio between the current (I) target value and the nominal current value (e.g., $I_{target}/I_{nominal}$). It should be noted that the nominal performance values (e.g., $Vt_{nominal}$, $I_{nominal}$, etc.) for each of the related semiconductor transistors (e.g., RVT, HVT, MVT, SVT, LVT, and UVT) will be specified (i.e., predetermined).

Figure 8:
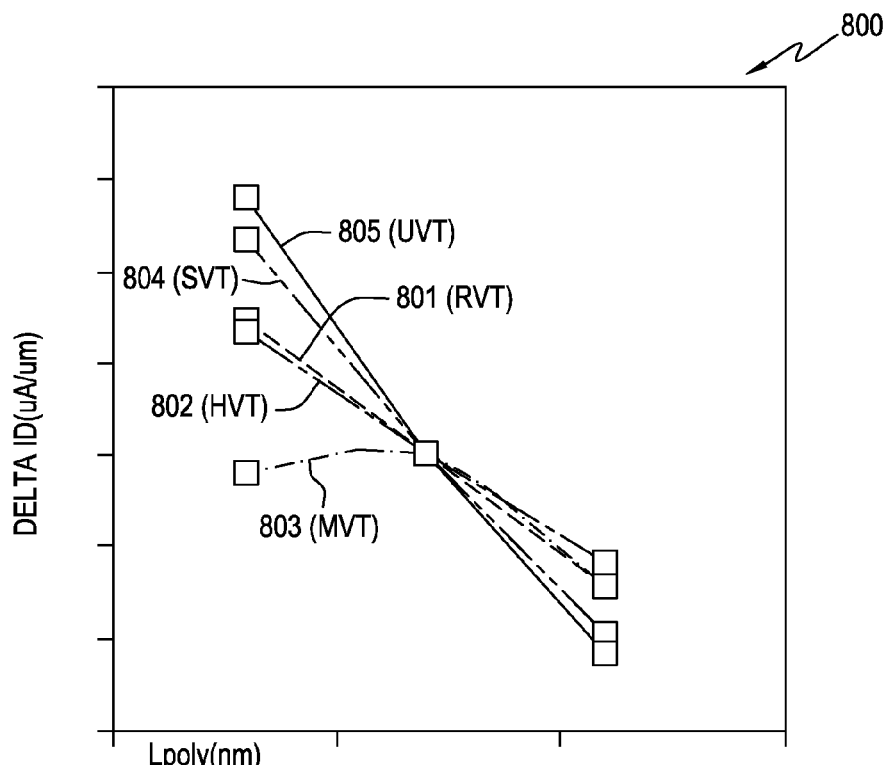
FIG. 8 is a graph illustrating process step 304 of FIG. 3.

For example, FIG. 8 illustrates an exemplary second graph 800 that corresponds to the first graph 700 of FIG. 7 and represents gate length (Lpoly (nm)). In this exemplary second graph, each second curve 801-805 is associated with one of the first curves 701-705 on the first graph 700 of FIG. 7 and represents one of the multiple different related transistors (e.g., transistors RVT 801, HVT 802, MVT 803, SVT 804, and UVT 805). For each of the related transistors 801-805, deviations in the values of the specific performance target, namely the current target (ID ($\mu$A/$\mu$m) (e.g. effective drive current (Ieff)) as compared to the nominal performance value (e.g., $Ieff_{nominal}$) are plotted to the values of the specific parameter, namely gate length (Lpoly (nm)). Plotting the deviations (i.e., the changes or deltas $\Delta$) enhances the effects previously seen in the first graph generated at process 302, thereby making any inconsistencies even easier to detect at process 108, as discussed in greater detail below. This plotting process 304 can further be repeated (305) such that similar second graphs are generated with respect to each of the multiple parameters at issue (e.g., gate width, operating temperature, operating supply voltage, etc.) and each of the multiple performance targets at issue (e.g., saturation drain current (Idsat), linear drain current (Idlin), linear threshold voltage (Vtlin), saturation threshold voltage (Vtsat), high current (Ihigh), low current (Ilow), effective drive current (Ieff), leakage current (Ioff), gate capacitance (Cgate-on), etc.).

Figure 4:
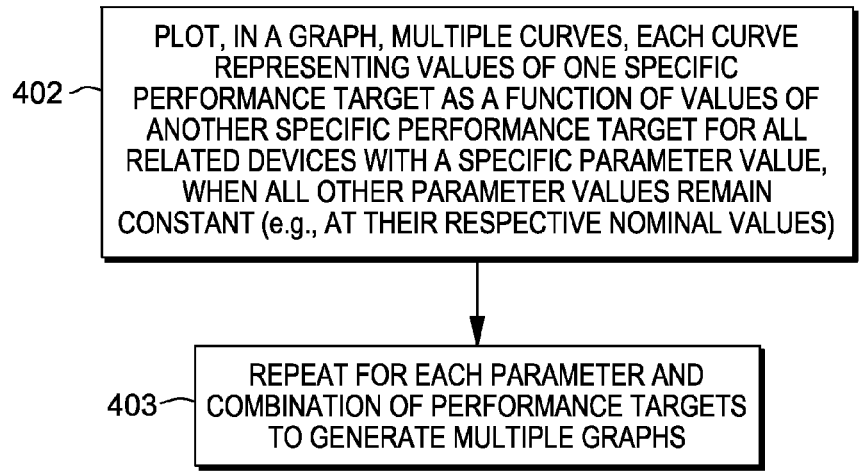
FIG. 4 is a flow diagram illustrating another exemplary plotting technique that can be incorporated into the method of FIG. 1.
Figure 9A:
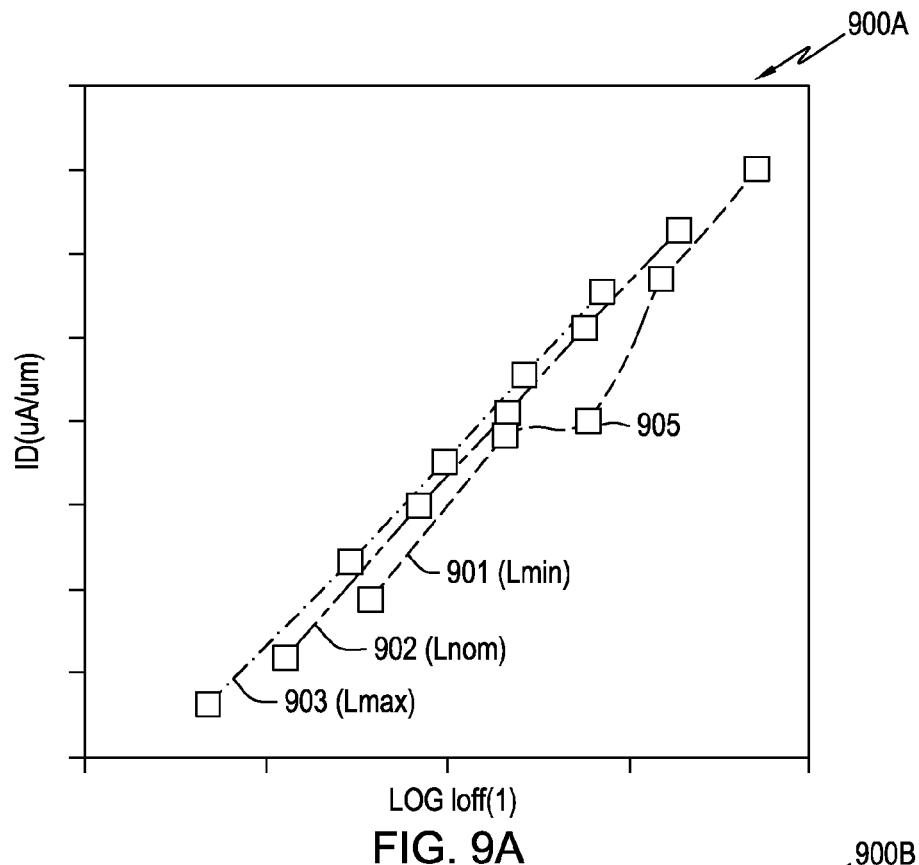
FIGS. 9A and 9B are graphs illustrating process step 402 of FIG. 4.
Figure 9B:
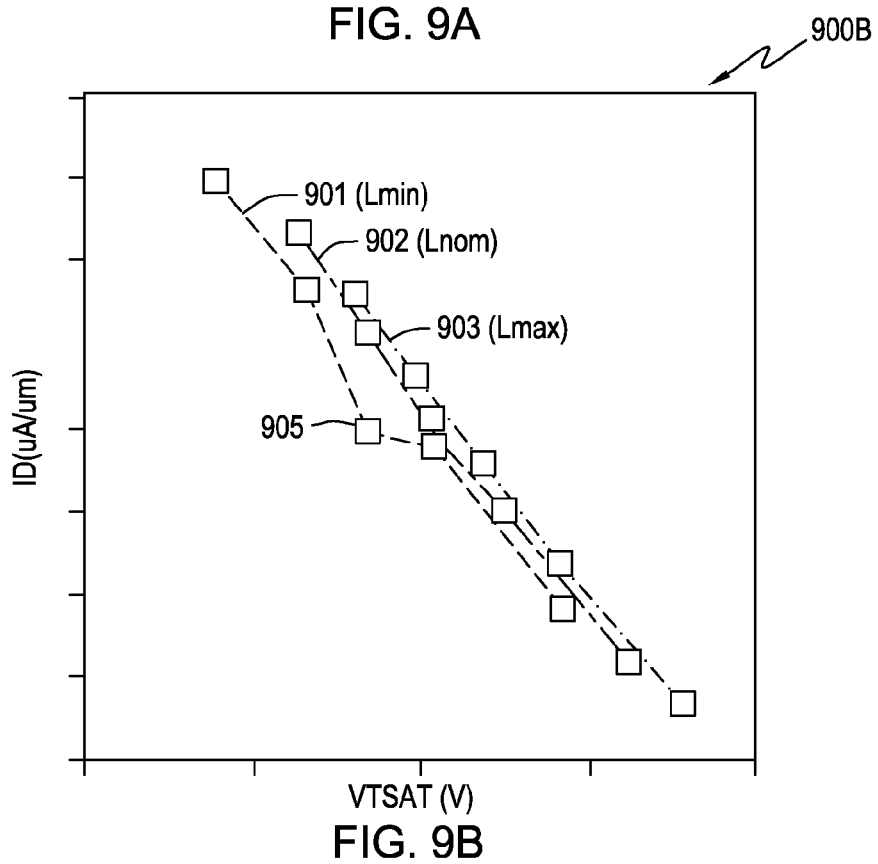
Figure 10A:
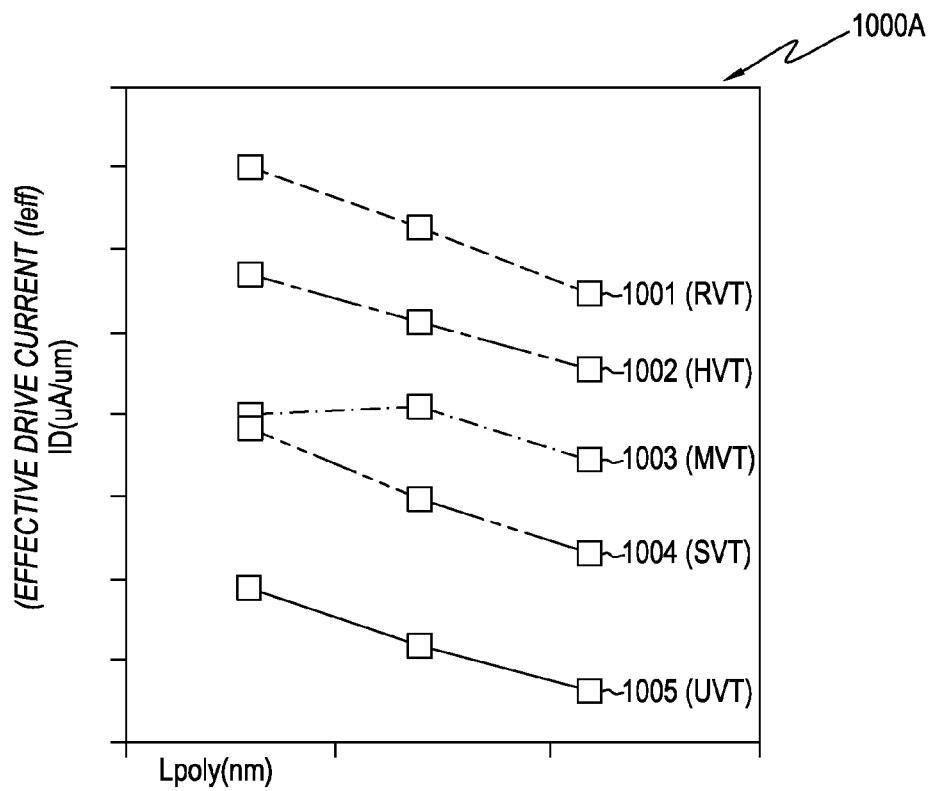
FIGS. 10A-10D are graphs illustrating process step 502 of FIG. 5.
Figure 10B:
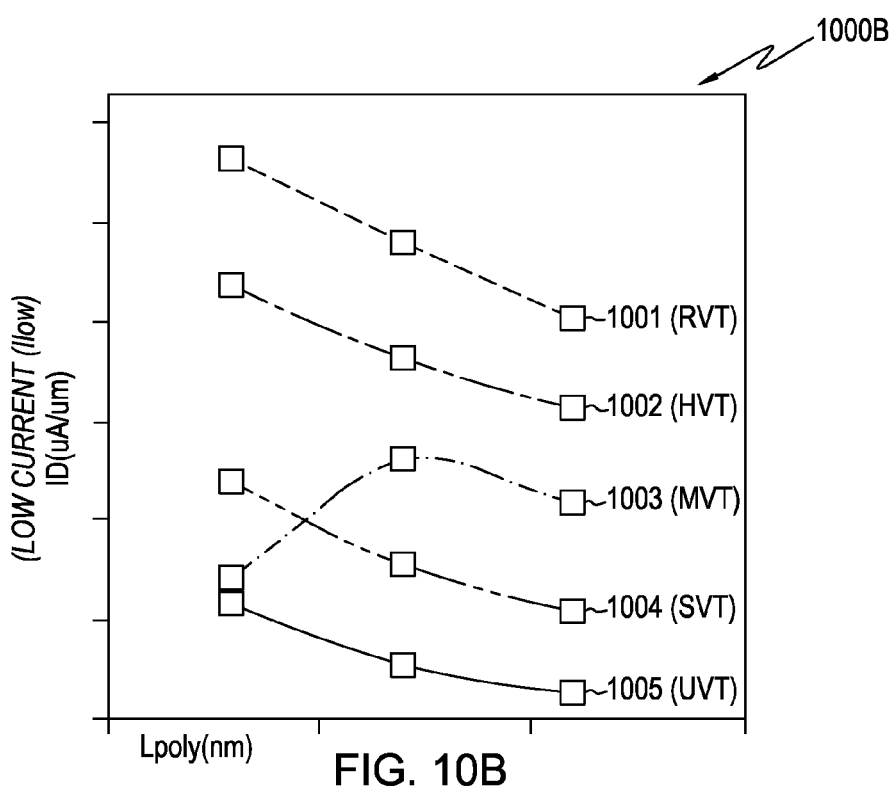
Figure 10C:
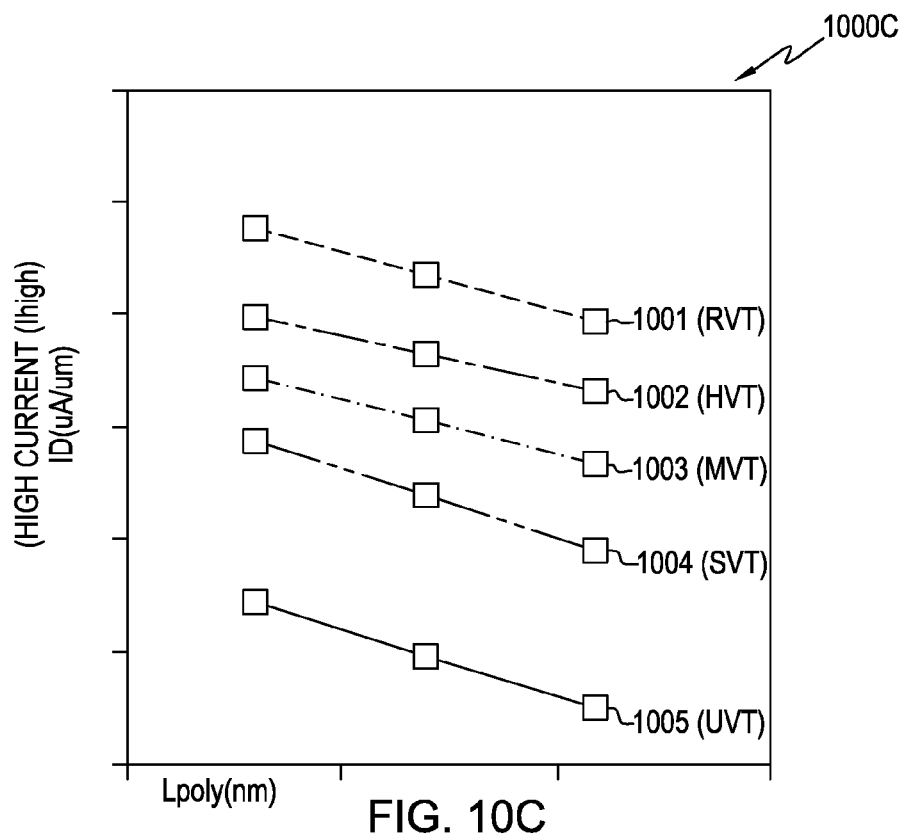
Figure 10D:
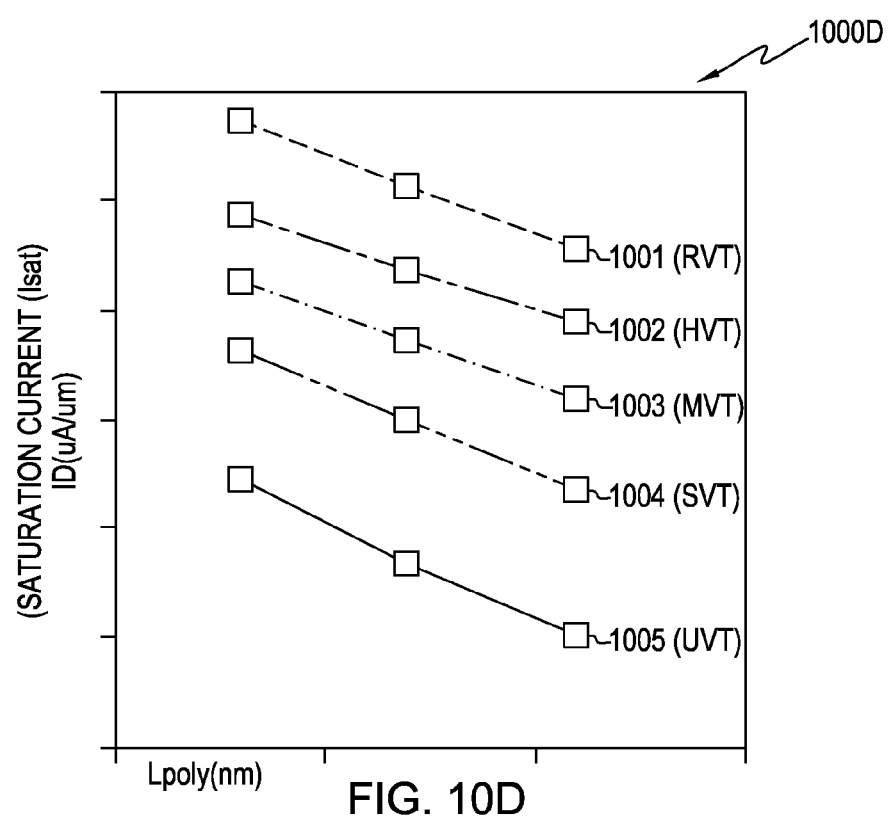

In another embodiment, as illustrated in FIG. 4, multiple curves can be plotted (i.e., graphed) on a graph such that the graph represents one specific parameter and such that each curve on the graph represents values of a first performance target as a function of values of a second performance target for all related semiconductor devices with the specific parameter at a specific value (402). That is, each curve on the graph can be associated with all related semiconductor devices (e.g., transistors RVT, HVT, MVT, SVT, LVT, and UVT) that have a specific parameter value and can show, for those related semiconductor devices, the values of a first performance target as a function of the values of a second performance target. For example, the graph 900a of FIG. 9A represents a specific parameter, namely gate length (Lpoly (nm)), and each curve 901-903 on the graph 900a is associated with a specific value for that specific parameter, namely a specific gate length. That is, there is a curve associated with a minimum gate length (Lmin) 901, a curve associated with a nominal gate length (Lnom) 902 and a curve associated with a maximum gate length (Lmax) 903. Each curve further represents values of one specific performance target, namely effective drive current (Ieff), as a function of values of another specific performance target, namely leakage current (Ioff), for the specific gate length. Similarly, the graph 900b of FIG. 9B represents a specific parameter, namely gate length (Lpoly (nm)), and each curve 901-903 on that graph is associated with a specific gate length, as in the graph of FIG. 9A. However, in this graph 900b each curve represents effective drive current (Ieff) values as a function of saturation threshold voltage (Vtsat) values for that specific gate length. This plotting process 402 can further be repeated (403) such that similar graphs are prepared with respect to each of the multiple parameters at issue (e.g., gate width, operating temperature, operating supply voltage, etc.) and combinations of each of the multiple performance targets at issue (e.g., saturation drain current (Idsat), linear drain current (Idlin), linear threshold voltage (Vtlin), saturation threshold voltage (Vtsat), high current (Ihigh), low current (Ilow), effective drive current (Ieff), leakage current (Ioff), gate capacitance (Cgate-on), etc.).

Figure 5:
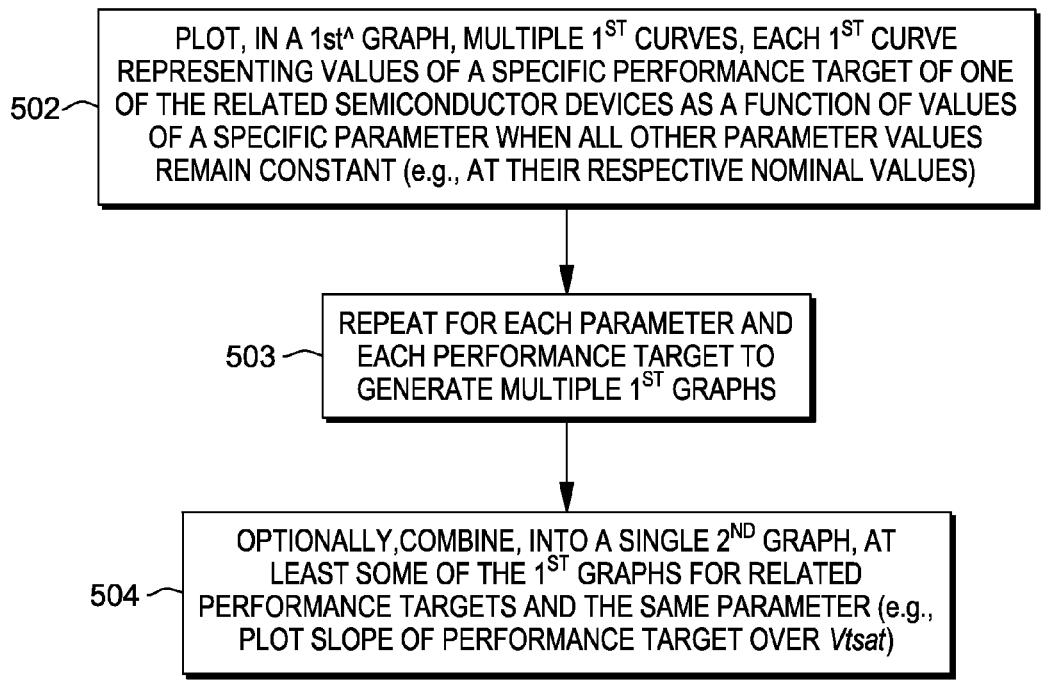
FIG. 5 is a flow diagram illustrating yet another exemplary plotting technique that can be incorporated into the method of FIG. 1.

In yet another embodiment, as illustrated in FIG. 5, multiple first curves can be plotted (i.e., graphed) on a first graph such that the first graph represents one specific parameter and such that each first curve on the first graph represents values of a specific performance target as a function of values of the specific parameter for one of the related semiconductor devices (502). This plotting process 502 can be performed in essentially the same manner as process 302 described in detail above. That is, it can be performed assuming that all other parameters are set at their respective nominal values (e.g., the operating temperature is set at 25° C., etc.). Additionally, this plotting process 502 can further be repeated (503) such that similar first graphs are generated with respect to each of the multiple parameters at issue (e.g., gate width, operating temperature, operating supply voltage, etc.) and each of the multiple performance targets at issue (e.g., saturation drain current (Idsat), linear drain current (Idlin), linear threshold voltage (Vtlin), saturation threshold voltage (Vtsat), high current (Ihigh), low current (Ilow), effective drive current (Ieff), leakage current (Ioff), gate capacitance (Cgate-on), etc.).

Figure 11:
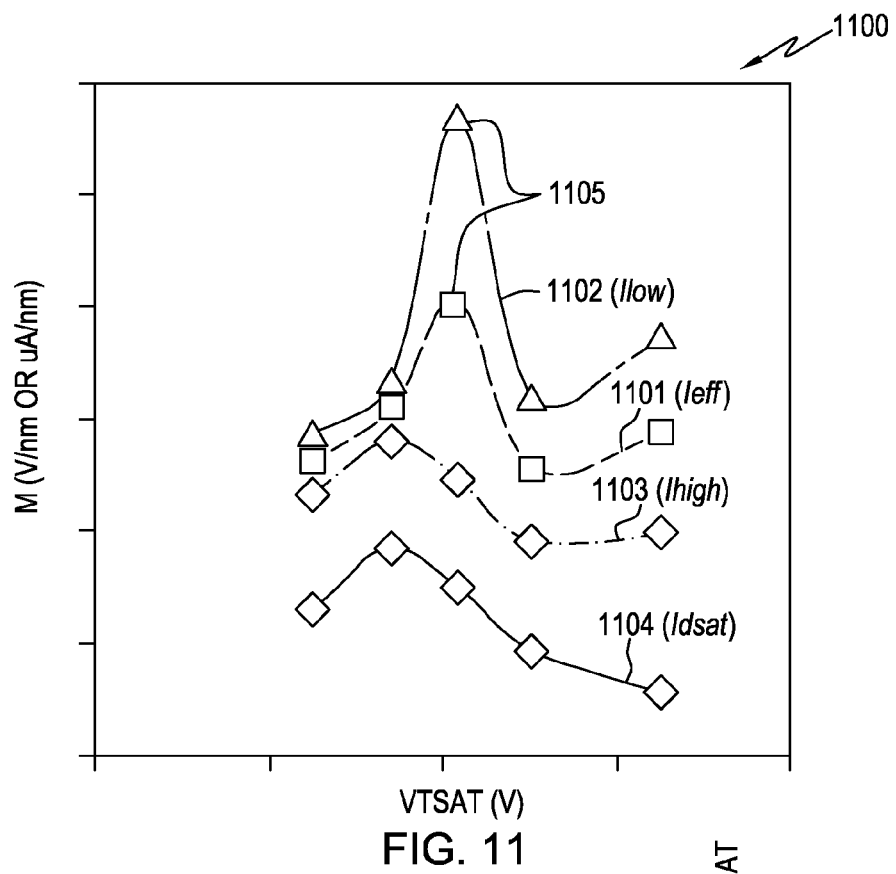
FIG. 11 is a graph illustrating process step 504 of FIG. 5.

Next, at least some of the first graphs for related performance targets (e.g., for different current targets) and the same parameter (e.g., gate length) can be combined into a single graph (504). For example, FIGS. 10A-10D illustrate exemplary first graphs 1000*a-d*, respectively, for different current targets as a function of gate length (Lpoly (nm)). In each one of these first graphs 1000*a-d*, each curve represents one of multiple different, but related transistors (e.g., transistors RVT 1001, HVT 1002, MVT 1003, SVT 1004, and UVT 1005). For each of the related transistors, values for a current target (ID ($\mu$A/$\mu$m) are plotted to gate length (Lpoly (nm)) values. For example, in FIG. 10A effective drive current (Id) values are plotted to gate length values, in FIG. 10B low current (blow) values are plotted to gate length, in FIG. 10C high current (Ihigh) are plotted to gate length and in FIG. 10D saturation drain current (Idsat) values are plotted to gate length. In order to combine the first graphs for related performance targets and the same parameter, multiple second curves can be plotted in a single second graph such that each second curve in the second graph is associated with a corresponding one of the multiple related performance targets and represents changes in slope of the multiple first curves as a function of values of another performance target (e.g., saturation threshold voltage (Vtsat) values). For example, FIG. 11 illustrates an exemplary second graph 1100 in which the multiple first graphs 1000*a-d* of FIGS. 10A-10D are combined. Specifically, the exemplary second graph 1100 of FIG. 11 shows multiple second curves 1101-1104 with each second curve representing the changes in slope of the multiple first curves from one of the different graphs 1000*a-d* of FIGS. 10A-10D as a function of saturation threshold voltage (Vtsat) values. That is, curve 1101 represents the changes in slope of the multiple effective drive current (Ieff) curves of the graph 1000*a* of FIG. 10*a* as a function of saturation threshold voltage (Vtsat) values, curve 1102 represents the changes in slope of the multiple low current (Ilow curves of the graph 1000*b* of FIG. 10*b* as a function of saturation threshold voltage (Vtsat) values, curve 1103 represents the changes in slope of the multiple high current (Ihigh) curves of the graph 1000*c* of FIG. 10*c* as a function of saturation threshold voltage (Vtsat) values, and curve 1103 represents the changes in slope of the multiple saturation current (Isat) curves of the graph 1000*c* of FIG. 10*c* as a function of saturation threshold voltage (Vtsat) values. Those skilled in the art will recognize that the slope of each first curves can be quantified by calculating the first derivative. Alternatively, each second curve in the single second graph can represent the change in curvature of the multiple first curves as a function of values of another performance target (e.g., saturation threshold voltage (Vtsat) values (not shown)). Those skilled in the art will recognize that the curvature of each of the first curves can be quantified by calculating the second derivative.

Figure 6:
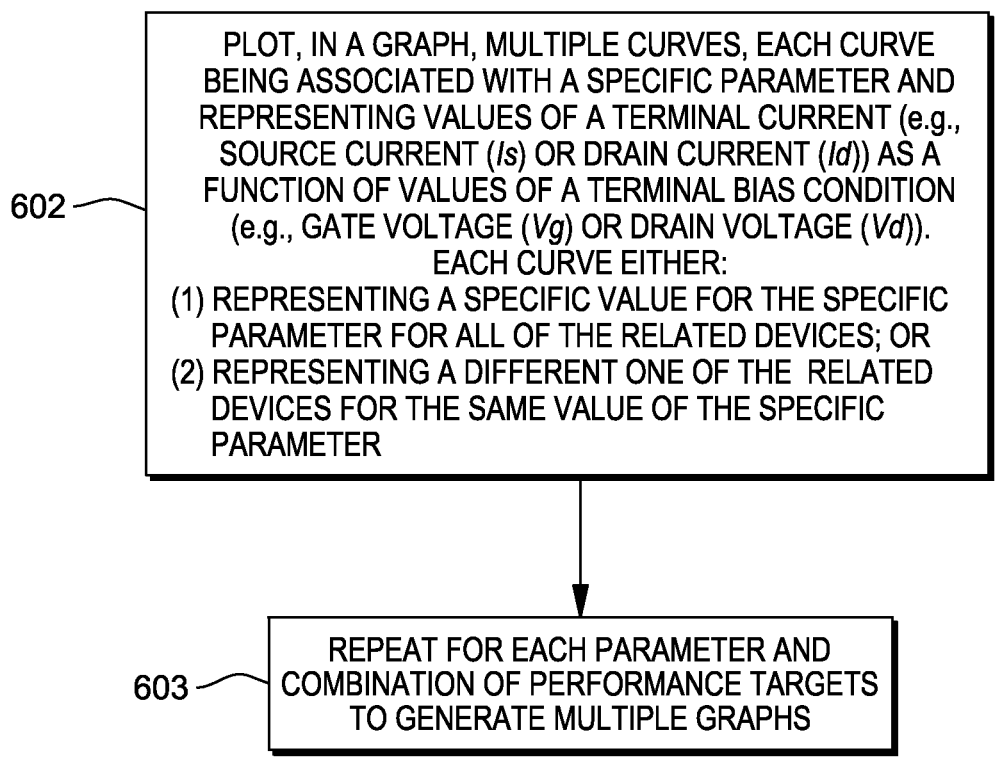
FIG. 6 is a flow diagram illustrating yet another exemplary plotting technique that can be incorporated into the method of FIG. 1.

In yet another embodiment, as illustrated in FIG. 6, multiple curves can be plotted in a graph such that each curve is associated with a specific parameter (e.g., gate length, gate width, temperature, etc.) and such that each curve represents values of a terminal current target (e.g., source current (Is) or drain current (Id)) as a function of a terminal bias condition target (e.g., gate voltage (Vg) or drain voltage (Vd)). The goal of this last embodiment is to construct, for example, current over voltage curves (i.e., I/V curves) as commonly used in measurement for device characterization out of the values from available sets of performance targets.

Figure 12:
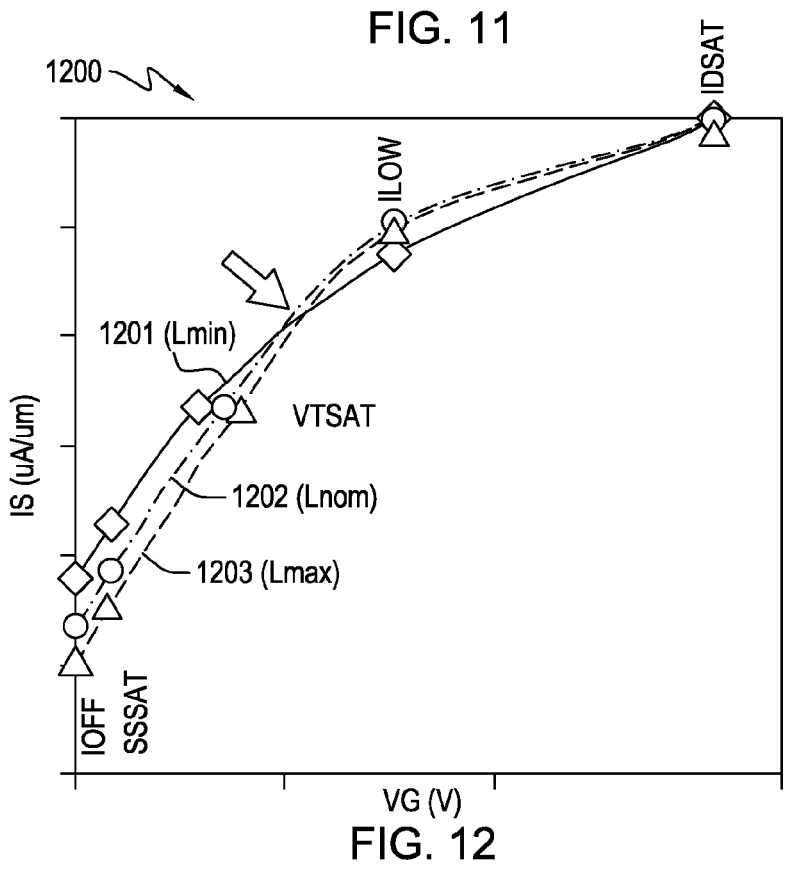
FIG. 12 is a graph illustrating process step 602 of FIG. 6.

Additionally, in the graph plotted at process 602, each curve can represent a specific value of the specific parameter for all of the related semiconductor devices (e.g., in essentially the same manner as discussed above with regard to process step 302 of the initial embodiment as shown in FIG. 3). For example, FIG. 12 illustrates an exemplary graph 1200 showing multiple curves 1201-1203 plotted such that each curve represents the input characteristics for a specific parameter value, namely gate length, for one specific related semiconductor device (e.g., MVT). That is, there is one curve 1201 for the minimum gate length (Lmin) of the MVT transistor, one curve 1202 for the nominal gate length (Lnom) of the MVT transistor and one curve 1203 for the maximum gate length (Lmax) of the MVT transistor. Additionally, in this exemplary graph 1200, each curve represents values of a terminal current as a function of values of a terminal bias condition and, particularly, values of source current (Is) as a function of values of gate voltage (Vgate). In this case, the voltage at the drain terminal (Vd) is by definition identical to the maximum supply voltage VDD. Furthermore, scanning along the variation of the gate voltage (Vg), multiple performance targets are met on the curves 1201-1203. For example, off current (Ioff) at Vg=0, saturation drain current (Idsat) at Vg=VDD, and low current (Ilow) at Vg=VDD/2. The saturation threshold voltage (Vtsat) is represented by the current IVT at Vg=Vtsat and the saturation sub threshold slope (SS-SAT) is represented by the source current ISS at Vg=Vlin as detailed in the table of FIG. 2.

Figure 13:
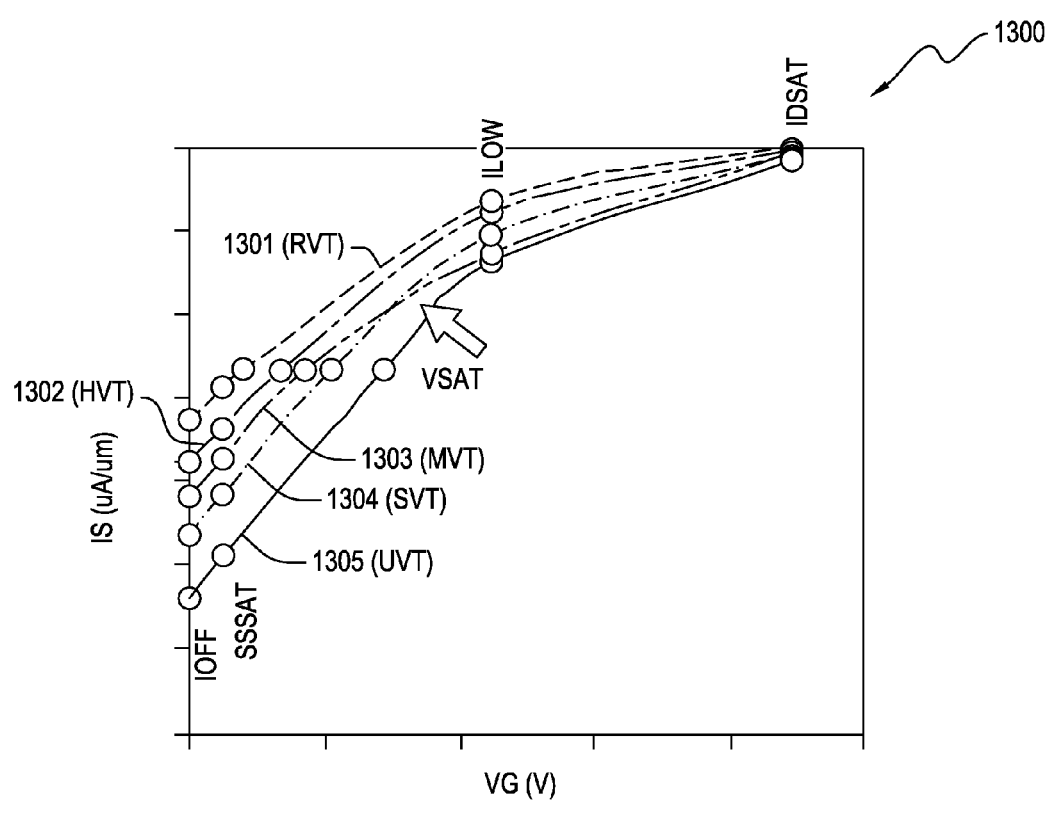
FIG. 13 is another graph illustrating process step 602 of FIG. 6.

Alternatively, in the graph plotted at process 602, each curve can represent a different, but related semiconductor device, (e.g., a different one of the transistors RVT, HVT, MVT, SVT, LVT, and UVT) for a same specific value of the specific parameter (e.g., for the same gate length value, the same gate width value, etc.). For example, FIG. 13 illustrates an exemplary graph 1300 shown multiple curves 1301-1305 plotted such that each curve represents values of a terminal current, namely source current (Is), as a function of values of a terminal bias condition, namely gate voltage (Vgate), for multiple different, but related transistors (e.g., transistors RVT 1301, HVT 1302, MVT 1303, SVT 1304, and UVT 1305) each having the same gate length value (e.g., the minimum gate length (Lmin)). Thus, in the graph 1300 of FIG. 13 each curve is an Is/Vgate curve allowing a comparison between different, but related transistors, for one specific condition, which in this case is minimum gate length (Lmin). Other performance targets that could be plotted using such a graph can include, for example, linear drain current (Idlin), high current Ihigh), and saturation drain current (Idsat). The resulting curve is then called the output characteristics or Id/Vd curve. It should be noted that for Is/Vgate curves and Id/Vdrain curves the performance targets should line-up, during the analysis process as discussed in greater detail below, in such a way that the behavior of measured curves from hardware will be reproduced. For many applications this coincides with the condition that the first derivative with respect to the gate voltage GM=d Isat/d Vgate is positive, the first derivative with respect to the drain voltage GDS=d Ieff/d Vdrain is positive, and the second derivatives are negative in both cases. It is important to note that the quality checks constructed from the curves of this last embodiment are orthogonal to the checks in the other embodiments described above. Since different performance targets are lined up on each curve, the correct relationship between those different performance targets can be verified during the analysis process discussed in detail below.

Referring again to FIG. 1, during the analysis process 108, the graphs generated in any of the plotting processes described above (e.g., see the graphs of FIGS. 7, 8, 9A-B, 10A-D, 11, 12 and 13) can be evaluated either by a user (i.e., visually) or by a computer (e.g., with a quadratic fit) to look for inconsistencies in the performance targets and, particularly, to look for any indication that the performance targets are inaccurate and/or violate the laws of device physics. Specifically, for each graph plotted at process 106, the curves can be compared at process 108 in order to find discrepancies in the plotted values on the curves, intersections between the curves, discrepancies in the slopes of the curves (as quantified by calculating the first derivatives) or curvature of the curves (as quantified by calculating the second derivatives) (see detailed discussion below) and to make conclusions as to what, if any, performance targets need adjusting based on the performance target(s), parameter(s) and device(s) represented in the graph.

The following formulas can, for example, be used to calculate the slope M and curvature C, respectively, of any of the above-described curves:

$$M = \frac{1}{D}[\langle\Delta y\Delta x^2\rangle\langle\Delta x\Delta x^2\rangle - \langle\Delta y\Delta x\rangle\langle(\Delta x^2)^2\rangle] \quad \text{(slope)} \quad (1)$$

$$C = \frac{2}{D}[\langle\Delta y\Delta x\rangle\langle\Delta x\Delta x^2\rangle - \langle\Delta y\Delta x^2\rangle\langle(\Delta x)^2\rangle] \quad \text{(curvature)} \quad (2)$$

Where |...| denotes the absolute value, <...> the mean value, and $$D = \langle\Delta x\Delta x^2\rangle^2 - \langle(\Delta x)^2\rangle\langle(\Delta x^2)^2\rangle \quad (3)$$

$$\langle\Delta x\Delta y\rangle \frac{1}{N}\sum_{i=1}^{N}(x_i - \langle x\rangle)(y_1 - \langle y\rangle) \quad \text{(covariance)} \quad (4)$$

The expression listed in equation (4) is known as covariance. Equations (1) to (4) are known from data analysis and can be applied to curves containing $N\geq 2$ values. Intersections between curves can be calculated following approximations by 2 second order polynomials $P=p+m_1 \cdot x+0.5 \cdot c_1 \cdot x^2$ and $Q=q+m_2 \cdot x+0.5 \cdot c_2 \cdot x^2$. The following casing applies:
(i) If $m_1=m_2$ and $c_1=c_2$, no intersection between the 2 polynomials P and Q is possible.
(ii) If $$Z = \left(\frac{m_1 - m_2}{c_1 - c_2}\right)^2 - 2\frac{p - q}{c_1 - c_2} < 0$$

no intersection is possible.
(iii) If $c_1=c_2$ one intersection is possible at $$x_1 = \frac{p - q}{m_2 - m_1}.$$

(iv) Else two intersections are possible at $$x_\pm = -\frac{m_1 - m_2}{c_1 - c_2} \pm \sqrt{\left(\frac{m_1 - m_2}{c_1 - c_2}\right)^2 - 2\frac{p - q}{c_1 - c_2}}.$$

Thus, for example, an analysis at process 108 of the exemplary graph 700 shown in FIG. 7 and generated at process 302 of FIG. 3 will show that the effective drive current (Ieff)/gate length (Lpoly) curve for the transistor having a mezzanine threshold voltage (MVT) intersects the Ieff/Lpoly curve for the transistor having a super-high threshold voltage (SVT), thereby indicating that the effective drive current (Ieff) targets for the MVT transistor may be inaccurate and need adjusting. The discrepancies noted from the analysis of the graph 700 of FIG. 7 may become even more evident or at least verified following the analysis of the exemplary graph 800 shown in FIG. 8 and generated at process step 304 of FIG. 3. Specifically, an analysis at process 108 of the graph of FIG. 8 will show that the ΔIeff/Lpoly curve for the MVT transistor strongly deviates from the ΔIeff/Lpoly curves for the other transistors, again indicating that the effective drive current (Ieff) performance targets for this MVT transistor may be inaccurate and need adjusting.

Similarly, an analysis at process 108 of the exemplary graphs shown in FIGS. 9A and 9B and generated at process 402 of FIG. 4, will show that the shapes of the effective drive current (Ieff)/off current (Ioff) and the effective drive current (Ieff)/saturation threshold voltage (Vtsat) curves, respectively, for the minimum gate length (Lmin) for all of the related transistors are significantly different from the shapes of the Ieff/Ioff and Ieff/Vtsat curves that are associated with the other gate lengths (e.g., the nominal gate length (Lnom) and the maximum gate length (Lmax)). The different shapes are due to an outlier 905 in one of the Ieff values and indicate that the effective drive current (Ieff) performance targets associated with all of the related transistors having this minimum gate length may be inaccurate and need adjusting.

Similarly, an analysis at process 108 of the exemplary graph shown in FIG. 11 and generated at process 504 of FIG. 4 will show the shapes of the slope M/Vtsat curves associated with the effective drive current (Ieff) and with the low current (Ilow) (i.e., curves 1101 and 1102) are significantly different from the shapes of the curves associated with high current (Ihigh) and saturation current (Idsat) (i.e., curves 1103 and 1104). The different shapes are due to outliers 1105 in the slope values on the Ieff and Ilow curves 1101, 1102 that result in sharper peaks in these curves as compared to the other curves and indicate that the effective drive current (Ieff) performance targets and the low current (Ilow) performance targets with respect to gate length the MVT transistor may be inaccurate and need adjusting.

Similarly, an analysis at process 108 of the exemplary graph shown in FIG. 12 and generated at process 602 of FIG. 6 will show that the source current (Is)/gate voltage (Vgate) curve 1201 for the minimum gate length (Lmin) for the MVT transistor intersects the Is/Vgate curves 1202 and 1203 for the other gate lengths (e.g., the nominal gate length (Lnom) and the maximum gate length (Lmax), thereby indicating that the source current (Is) target with respect to that minimum gate length (Lmin) for the MVT devices may be inaccurate and need adjusting. An analysis at process 108 of the exemplary graph shown in FIG. 13 and generated at process 602 of FIG. 6 will show that the source current (Is)/gate voltage (Vgate) curve 1303 for the minimum gate length (Lmin) for the MVT transistor intersects the Is/Vgate curve 1304 for the SVT transistor, thereby indicating that the source current (Is) target with respect to that minimum gate length (Lmin) for the MVT transistor and/or the SVT transistor in particular may be inaccurate and need adjusting. Those skilled in the art will confirm that the intersections in FIGS. 12 and 13 are caused by the wrong target of the low current (Ilow), because elevating the value of the performance target ILOW of the MVT device to a value between the ILOW value of the HVT and SVT device will eliminate the problem of curve crossing.

Optionally, during the analysis process 108 of any of these graphs, a correlation coefficient and, particularly, a Pearson correlation coefficient for a second order polynomial fit to the plotted curves can be calculated and used to further automate the detection of inconsistencies. The Pearson correlation coefficient measures the difference between the values of a curve and its fit by calculating the covariance of the curve fit with the curve values themselves divided by their standard deviations. In case of a large number of curve values with a completely random distribution no meaningful curve fit can be found and the Pearson correlation coefficient turns out to equal 0. On the other hand, independent of the number of values on the curve, if every value can be perfectly reproduced by the curve fit, the Pearson correlation coefficient turns out to be 1. The use of a Pearson correlation coefficient for measuring the strength of a relationship between variables is well known in the art and, thus, the details of its use are omitted from this specification so as to allow the reader to focus on the salient aspects of the disclosed embodiments. However, it should be understood that in this case a Pearson correlation coefficient that is relatively low (i.e., close to zero, e.g., between 0 and 0.7) as opposed to relatively high (i.e., at or near +1.0) will be indicative of little to no correlation and, thereby indicative of inconsistencies. Consider for example the three curves 901-903 for the different gate lengths Lmin, Lnom, and Lmax, respectively, in FIG. 9B as a function of the first performance target Ieff over the second performance target Vtsat of the related devices. The curves 902 and 903 for Lnom and Lmax show a relatively smooth behavior, such that a second order polynomial fit is well suited to agree with the curve and therefore leads to a result for the Person correlation coefficient very close to 1.0. The curve 901 for Lmin, however, is significantly disturbed by the wrong target of Ieff and the Vtsat value of the MVT transistor. Thus, a second order polynomial fit will not be able to describe the curve of the performance targets Ieff correctly. Significant deviations will remain between the polynomial fit and the curve values leading to a result for the Pearson correlation coefficient well below 1.0. The calculation of the Pearson correlation coefficient can therefore be used to automatically detect inconsistencies in the various curves of the graphs plotted in any of the embodiments, as described in detail above and illustrated in FIGS. 3-6.

The results of the analysis of the graphs at process 108 can further be complied and input into a summary table. For example, FIG. 14 is an illustration of a portion of an exemplary summary table. This portion of the exemplary summary table shows columns for different related semiconductor devices (e.g., RVT transistors, HVT transistors, and MVT transistors) and rows for curves representing different performance targets (e.g., effective drive current (Ieff), current high (Ihigh), current low (Ilow), etc.) as a function of gate length scaling (i.e., as a function of different gate length values). The table entries can specify for each different transistor whether an error was detected or not in a performance target value, the slope of the curve, or the curvature (i.e., shape) of the curve. For example, the table entry for the effective drive current (Ieff) of the MVT can be generated based on the curve for the MVT transistor shown in the graph of FIG. 7. In this case, the values on the curve and the slope of the curve (as quantified by calculating a first derivative) are within a specific predefined range of values and are satisfactory (i.e., don't indicate a problem or error), but the curvature (i.e., shape as quantified by calculating a second derivative) is not (i.e., does indicate a problem or error) because the curve opens downward and the curvature values are outside of a specific predefined range of values. Additionally, the table entry for the low current (Ilow) of the same MVT can be generated based on the curve for the MVT transistor shown in the graph shown in FIG. 10B. In this case, the values on the curve are satisfactory (i.e., don't indicate a problem or error); however, the slope (as quantified by calculating a first derivative), which is initially positive, and the curvature (i.e., shape as quantified by calculating a second derivative), which opens downward, are not satisfactory (i.e., indicate a problem or error). Other columns in this table can, for example, display inconsistencies with respect to the Is/Vgate and Id/Vdrain curves analyzed in the last embodiment described above and shown in FIG. 6 and unwanted intersections between two neighboring curves of two related devices in graphs plotted in the other embodiments, described in detail above and shown in FIGS. 3-5. Engineers can subsequently use this summary table to adjust the performance targets in the initial sets of performance targets in order to resolve any inconsistencies contained therein. That is, Engineers can subsequently use this summary table to replace performance targets that results in such errors with other performance targets. Consequently, the processes 106-108 effectively eliminate performance targets that are inaccurate and, particularly, that actually violate the principles of semiconductor device physics and/or scaling laws.

It should be noted that, in addition to resolving any inconsistencies in the initial sets of performance targets generated, the plotting and analysis processes 106-108 described above can further be used to fill in blanks not covered by the initial sets of performance targets (110). That is, the plotting and analysis processes 106-108 can also be used to create a new set of performance targets for a related semiconductor device not associated with any of the initial sets (e.g., for a transistor have essentially the same geometry but a different threshold voltage than the other transistors covered by the initial sets of performance targets). Alternatively, these plotting and analysis processes 106-108 can be used to create at least one new performance target for an incomplete set of performance targets in the initial sets.

It should be understood that the various plotting techniques, which are shown in FIGS. 3-6 and described above, could be performed in the alternative. However, to provide the greatest amount of inconsistency detection sensitivity (i.e., increase the likelihood that any inconsistencies in the performance targets will be detected) during the analysis process 108 it is advisable that at process 106 more than one of the plotting techniques and, preferably, all of the plotting techniques be performed in order to increase the accuracy of the performance targets, as adjusted.

Finally, at the modeling stage, the consistency of these performance targets, as adjusted at process 108, can be verified against prototype hardware measurements and, if consistent, used as inputs for semiconductor device modeling (112). That is, at the modeling stage, prototype hardware measurements (i.e., early hardware measurements) can be plotted against the performance targets, as adjusted at process 108, to visually determine whether the performance targets that will be used for modeling are supported by the hardware measurements (i.e., to visually verify the accuracy of the performance targets). However, since inaccurate performance targets were already adjusted (i.e., screened) in order to eliminate performance targets which actually violate the principles of semiconductor device physics and/or scaling laws, the likelihood that inaccurate performance targets will be used as inputs at the modeling stage is reduced. Consequently, unnecessary model extraction iterations, inferior models and false conclusions regarding device performance are avoided.

Also disclosed herein are embodiments of computer for implementing the above-describe method embodiments and a non-transitory program storage device (i.e., a computer program product) readable by a computer and tangibly embodying a program of instructions executable by the computer to perform the above-described method embodiments.

Specifically, as will be appreciated by one skilled in the art, aspects of the embodiments herein may be embodied as a system, method or program storage device (i.e., a computer program product). Accordingly, aspects of the embodiments herein may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the embodiments herein may take the form of a computer program product embodied in one or more computer readable medium(s) having computer readable program code embodied thereon.

Any combination of one or more computer readable medium(s) may be utilized. The computer readable medium may be a non-transitory computer readable storage device or a computer readable signal medium. A non-transitory computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

As mentioned above, the computer readable medium can alternatively comprise a computer readable signal medium that includes a propagated data signal with computer readable program code embodied therein, for example, in baseband or as part of a carrier wave. Such a propagated signal may take any of a variety of forms, including, but not limited to, electromagnetic, optical, or any suitable combination thereof. This computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 15:
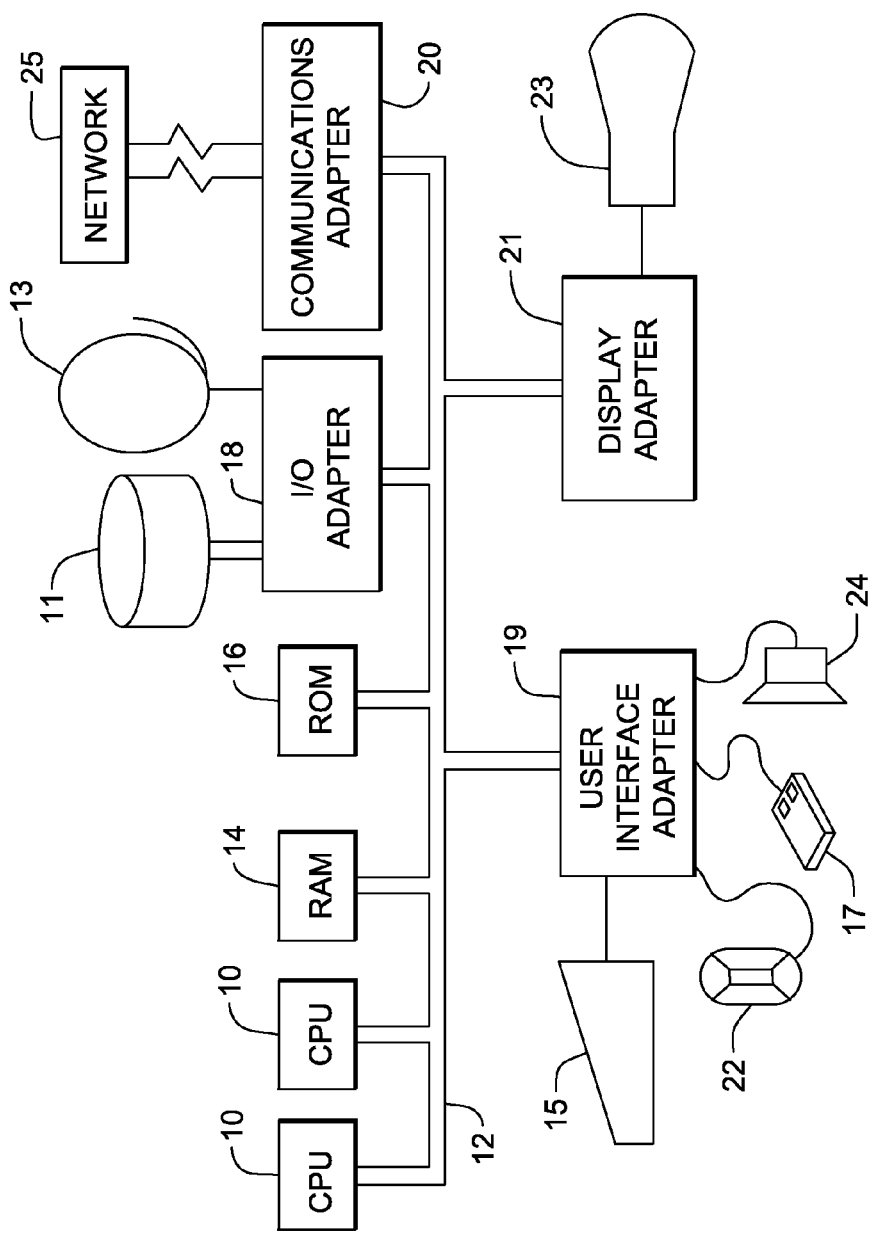
FIG. 15 is a schematic diagram illustrating an exemplary hardware environment for implementing the disclosed embodiments.

As mentioned above, a representative hardware environment is depicted in FIG. 15 for implementing the disclosed method, system and program storage device (i.e., computer program product) embodiments, as discussed in detail above. This schematic drawing illustrates a hardware configuration of an information handling/computer system in accordance with the disclosed embodiments. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the disclosed embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example. Alternatively, the disclosed method, system and program storage device embodiments could be implemented on any other computerized device having the processing capability described (e.g., a laptop computer, tablet computer, handheld device, smart phone, etc.). Alternatively, the disclosed method, system and program storage device embodiments could be implemented on any other computerized device having the data storage and processing capability to perform the described plotting and analysis (e.g., a laptop computer, tablet computer, handheld device, smart phone, etc.).

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises", "comprising", "included", and/or "including", when used in this specification, specify the presence of stated features, integers, steps, operations, elements, and/or components, but do not preclude the presence or addition of one or more other features, integers, steps, operations, elements, components, and/or groups thereof. It should further be understood that corresponding structures, materials, acts, and equivalents of all means or step plus function elements in the claims below are intended to include any structure, material, or act for performing the function in combination with other claimed elements as specifically claimed. Finally, it should be understood that the above-description of the embodiments was presented for purposes of illustration and was not intended to be exhaustive or limiting. Many modifications and variations will be apparent to those of ordinary skill in the art without departing from the scope and spirit of the disclosed embodiments.

Therefore, disclosed above are embodiments of a computer-implemented method as well as an associated system and program storage device for generating more accurate performance targets (i.e., target performance characteristics) for active semiconductor devices during the technology node development stage in order to reduce the number of iterations required for model extraction and/or to improve model quality. In these embodiments, initial sets of performance targets for related semiconductor devices can be generated using, for example, prior art techniques of making assumptions based on hardware measurements taken from semiconductor devices in prior technology nodes and/or from preliminary hardware with limited quality of the technology node under development and/or numerical simulations (Technology Computer Aided Design) for the same technology node. However, instead of simply relying on these initial sets at the modeling stage, additional processes can be performed prior to the modeling stage to detect and resolve any inconsistencies between the data in the sets. Specifically, various plotting techniques can be performed with respect to the performance targets and the results can be analyzed to detect any inconsistencies, which may indicate inaccurate performance targets and, particularly, which may indicate that the performance targets would violate the laws of device physics. Then adjustments can be made to the performance targets in order to resolve those inconsistencies.

What is claimed is:

1. A computer-implemented method for generating performance targets for related semiconductor devices, during development of a new technology node, said method comprising:
   accessing, by a computer, initial sets of performance targets, each initial set being associated with a corresponding one of said related semiconductor devices, comprising multiple performance targets associated with multiple values of multiple parameters and being generated based on at least one of prior technology node hardware measurements, new technology node prototype hardware measurements and new technology node numerical simulations;
   plotting, by said computer in a first graph, multiple first curves such that each first curve is associated with a different one of said related semiconductor devices and represents values of a specific performance target as a function of values of a specific parameter for a corresponding one of said related semiconductor devices; and
   analyzing, by one of said computer and a user, said first graph to identify inconsistencies that are indicative of inaccurate performance targets in said initial sets and to adjust said performance targets to resolve said inconsistencies and eliminate said inaccurate performance targets before using said initial sets in a modeling stage in said development of said new technology node.

2. The method of claim 1,
   said plotting further comprising plotting, in a second graph, multiple second curves such that each second curve is associated with one of said first curves from said first graph and represents deviations in said values of said specific performance target over a nominal performance value as a function of said values of said specific parameter,
   said analyzing further comprising analyzing said second graph to identify said inconsistencies, and
   said method further comprising repeating said plotting and said analyzing for each of said multiple parameters.

3. The method of claim 1, said plotting being performed assuming that all parameter values other than that of said specific parameter remain constant.

4. The method of claim 1, said analyzing comprising calculating, by said computer, a correlation coefficient for a second order polynomial fit to any one of said multiple first curves in said first graph, said correlation coefficient, when relatively low, being indicative of said inconsistencies.

5. The method of claim 1, said related semiconductor devices comprising related transistors and said multiple parameters comprising at least gate length, gate width, operating temperature, and supply voltage.

6. The method of claim 1, said related semiconductor devices comprising related transistors having essentially identical geometries, said related transistors further having different threshold voltages (Vt), said different threshold voltages (Vt) resulting from differences in doping profiles.

7. The method of claim 1, wherein results are displayed in a summary table.

8. The method of claim 1, said analyzing further being performed to generate any one of the following:
   a new set of performance targets for a related semiconductor device not associated with any of said initial sets; and
   at least one new performance target for an incomplete set of performance targets in said initial sets.

9. A computer-implemented method for generating performance targets for related semiconductor devices, during development of a new technology node, said method comprising:

accessing, by a computer, initial sets of performance targets, each initial set being associated with a corresponding one of said related semiconductor devices, comprising multiple performance targets associated with multiple values of multiple parameters and being generated based on at least one of prior technology node hardware measurements, new technology node prototype hardware measurements and new technology node numerical simulations;

plotting, by said computer and in a graph, multiple curves such that each curve represents values of a first performance target as a function of values of a second performance target for a specific value of a specific parameter for all of said related semiconductor devices; and analyzing, by one of said computer and a user, said graph to identify inconsistencies that are indicative of inaccurate performance targets in said initial sets and to adjust said performance targets to resolve said inconsistencies and eliminate said inaccurate performance targets before using said initial sets in a modeling stage in said development of said new technology node.

10. The method of claim 9, said first performance target comprising effective drive current (Ieff) and said second performance target comprising any of leakage current (Ioff) and saturation threshold voltage (Vtsat).

11. The method of claim 9, said plotting being performed assuming that all parameter values other than said specific value of said specific parameter remain constant.

12. The method of claim 9, said analyzing further comprising calculating, by said computer, a correlation coefficient for a second order polynomial fit to any one of said multiple curves in said graph, said correlation coefficient, when relatively low, being indicative of said inconsistencies.

13. The method of claim 9, said related semiconductor devices comprising related transistors and said multiple parameters comprising at least gate length, gate width, operating temperature, and supply voltage.

14. The method of claim 9, said related semiconductor devices comprising related transistors having essentially identical geometries, said related transistors further having different threshold voltages (Vt), said different threshold voltages (Vt) resulting from differences in doping profiles.

15. The method of claim 9, wherein results are displayed in a summary table.

16. The method of claim 9, said analyzing further being performed to generate any one of the following:
a new set of performance targets for a related semiconductor device not associated with any of said initial sets; and
at least one new performance target for an incomplete set of performance targets in said initial sets.

17. A computer-implemented method for generating performance targets for related semiconductor devices, during development of a new technology node, said method comprising:

accessing, by a computer, initial sets of performance targets, each initial set being associated with a corresponding one of said related semiconductor devices, comprising multiple performance targets associated with multiple values of multiple parameters and being generated based on at least one of prior technology node hardware measurements, new technology node prototype hardware measurements and new technology node numerical simulations;

plotting, by said computer in a first graph, multiple first curves such that each first curve is associated with a different one of said related semiconductor devices and represents values of a specific performance target for a corresponding one of said related semiconductor devices as a function of values of a specific parameter;

repeating, by said computer, said plotting of said multiple first curves for said multiple performance targets so as to generate multiple first graphs;

combining, by said computer, at least some of said first graphs into a single second graph, said combining comprising plotting, by said computer in said second graph, multiple second curves such that each second curve is associated with a corresponding one of said first graphs and represents changes in any one of slope and curvature of said multiple first curves as a function of saturation threshold voltage (Vtsat) values;

analyzing, by one of said computer and a user, results of said plotting of said multiple second curves to identify inconsistencies that are indicative of inaccurate performance targets in said initial set and to adjust said performance targets to resolve said inconsistencies and eliminate said inaccurate performance targets before using said initial sets in a modeling stage in said development of said new technology node.

18. The method of claim 17, said at least some of said first graphs representing different current targets.

19. The method of claim 17, said plotting of said multiple first curves being performed assuming that all parameter values other than that of said specific parameter remain constant.

20. The method of claim 17, said related semiconductor devices comprising related transistors and said multiple parameters comprising at least gate length, gate width, operating temperature, and supply voltage.

21. The method of claim 17, said related semiconductor devices comprising related transistors having essentially identical geometries, said related transistors further having different threshold voltages (Vt), said different threshold voltages (Vt) resulting from differences in doping profiles.

22. The method of claim 17, said results being displayed in a summary table.

23. The method of claim 17, said analyzing further being performed to generate any one of the following:
a new set of performance targets for a related semiconductor device not associated with any of said initial sets; and
at least one new performance target for an incomplete set of performance targets in said initial sets.

24. A computer-implemented method for generating performance targets for related semiconductor devices, during a development stage of a new technology node, said method comprising:

accessing, by a computer, initial sets of performance targets, each initial set being associated with a corresponding one of said related semiconductor devices, comprising multiple performance targets associated with multiple values of multiple parameters and being generated based on at least one of prior technology node hardware measurements, new technology node prototype hardware measurements and new technology node numerical simulations;

plotting, by said computer in a graph, multiple curves such that each curve is associated with at least one specific parameter and represents values of a terminal current target as a function of values of a terminal bias condition target;

analyzing, by one of said computer and a user, results of said plotting of said multiple curves to identify inconsistencies indicative of inaccurate performance targets in said initial set and to adjust said performance targets to resolve said inconsistencies and eliminate said inaccurate performance targets before using said initial sets in a modeling stage in said development of said new technology node.

25. The method of claim 24, said multiple curves being plotted such that each first curve represents one of the following:
- a specific value of said specific parameter for all of said related semiconductor devices; and
- a different one of said related semiconductor devices for a specific value of said specific parameter.

* * * * *